United States Patent [19]
Sato et al.

[11] Patent Number: 5,158,897
[45] Date of Patent: Oct. 27, 1992

[54] METHOD FOR THE PRODUCTION OF A SEMICONDUCTOR DEVICE BY IMPLANTING FLUOROCARBON IONS

[75] Inventors: Hiroya Sato, Tenri; Toshiaki Kinosada, Izumi; Yasuhito Nakagawa, Nara, all of Japan

[73] Assignee: Sharp Kabushiki Kaisha, Osaka, Japan

[21] Appl. No.: 740,197

[22] Filed: Aug. 2, 1991

[30] Foreign Application Priority Data

Aug. 3, 1990 [JP] Japan ................... 2-207001

[51] Int. Cl.⁵ .......................... H04L 21/265
[52] U.S. Cl. ...................... 437/18; 437/22; 437/930
[58] Field of Search ............ 437/18, 20, 22, 24, 437/930; 148/DIG. 83, DIG. 84

[56] References Cited

FOREIGN PATENT DOCUMENTS 63-244842 10/1988 Japan.
157627 3/1989 Japan ..................................... 437/18

OTHER PUBLICATIONS

Yamahata et al., *Shingaku-Giho Electronic Devices*, ED89-56, (1989), pp. 43–48.

*Primary Examiner*—Olik Chaudhuri
*Assistant Examiner*—G. Fourson
*Attorney, Agent, or Firm*—Morrison & Foerster

[57] ABSTRACT

There is provided a method for producing a semiconductor device having a semiconductor layer in which carbon is implanted as an impurity. The method includes the steps of: implanting fluorocarbon ions in a semiconductor layer; and annealing the semiconductor layer to activate the implanted ions.

3 Claims, 2 Drawing Sheets

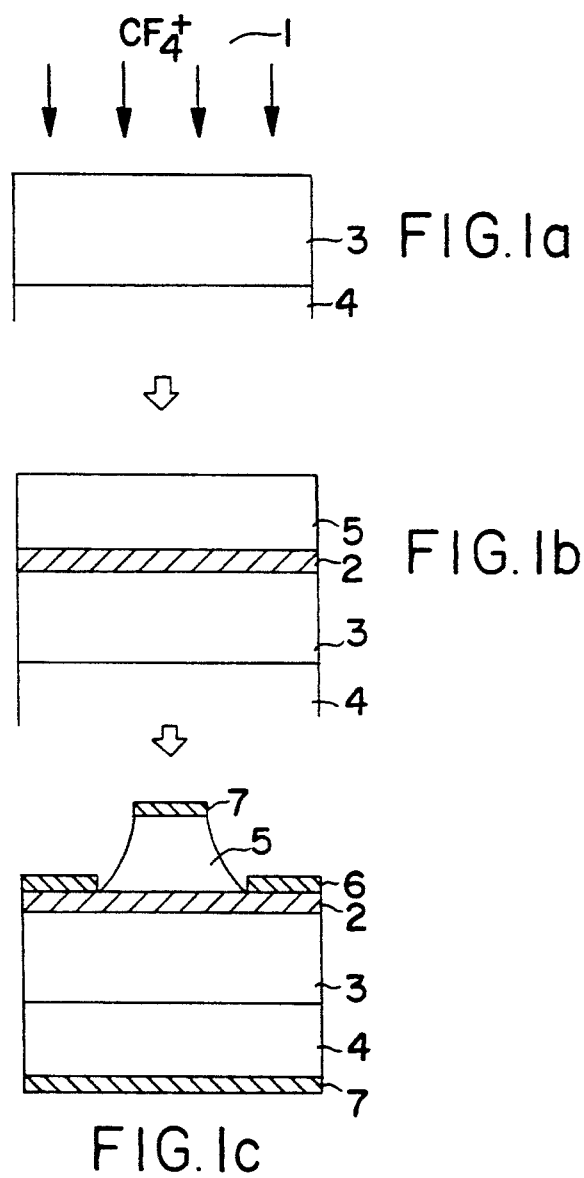

METHOD FOR THE PRODUCTION OF A SEMICONDUCTOR DEVICE BY IMPLANTING FLUOROCARBON IONS

BACKGROUND OF THE INVENTION

1. Field of the Invention

This invention relates to a method for the production of a semiconductor device, and more particularly, it relates to a method for the production of a compound semiconductor device which requires accurate control in the depth of impurity ions implanted into a semiconductor layer.

2. Description of the Prior Art

With a recent development in compound semiconductor devices, there is an increasing demand for the implantation of p-type impurity ions into a compound semiconductor for the purpose of producing a semiconductor device with improved characteristics at a lower cost.

As an example of compound semiconductor devices, a heterojunction bipolar transistor (hereinafter abbreviated as an "HBT") is shown in FIG. 2. A conventional process for producing this HBT will be described below.

First, on an $n^+$-GaAs substrate 4, an $n^-$-GaAs collector layer 3 is formed. Then, p-type impurity ions are implanted into the $n^-$-GaAs collector layer 3, followed by annealing for activation, resulting in a p-type base layer 8. On the p-type base layer 8, an n-AlGaAs emitter layer 5 is grown. Thereafter, n-sided contact electrodes 7 are formed from AuGe/Ni/Au respectively on the upper face of the n-AlGaAs emitter layer 5 and on the back face of the $n^+$-GaAs substrate 4. The contact electrode 7 on the n-AlGaAs emitter layer 5 functions as an emitter electrode, while the contact electrode 7 on the $n^+$-GaAs substrate 4 functions as a collector electrode.

Then, part of the n-AlGaAs emitter layer 5 and n-sided contact electrode 7 formed thereon is removed by mesa etching in an etchant containing phosphoric acid, thereby exposing the corresponding part of the p-type base layer 8. On the exposed surface of the p-type base layer 8, p-sided contact electrodes 6 are formed from AuZn/Au as base electrodes, resulting in an HBT shown in FIG. 2.

The base width (the thickness of the base layer 8) in the thus produced HBT is one of the important parameters which determine the characteristics of the HBT. In order to accurately control the base width, the impurity ions implanted into the $n^-$-GaAs collector layer 3 are required to have a sharp and accurate distribution even after the activation annealing and other heat treatments for further crystal growth.

Beryllium (Be) and zinc (Zn) are known as p-type impurities used in ion implantation for the formation of a base layer. However, neither of them are suitable for practical use for the following reasons. Be is toxic and has a large diffusion coefficient in a compound semiconductor. Zn also has a large diffusion coefficient when implanted into a compound semiconductor layer, and is likely to be removed away from the surface of the compound semiconductor layer during the subsequent activation annealing. Therefore, the use of carbon ions for ion implantation has been proposed because carbon has no toxicity and has a small diffusion coefficient when implanted into a compound semiconductor (see, e.g., S. Yamahata, Shingaku-Giho Electronic Devices, ED89-56 (1989)).

Alternatively, an ion implantation method has been developed where $SiF^+$ or $SiF_2^+$ ions are implanted in a compound semiconductor layer (see, e.g., Japanese Laid-Open Patent Publication No. 63-244842).

In order to produce a semiconductor device with excellent characteristics, the thickness of each layer in the device should be made small. However, it is impossible to form a thin doped layer using the implantation of carbon ions, as will be described below.

When carbon ions are introduced as an impurity into a semiconductor layer to form a doped layer therein, the projected range (i.e., Rp) of the implanted carbon ions is large because carbon has a small atomic weight. Such a large projected range makes it difficult to obtain a shallow and sharp distribution of the implanted carbon ions at an acceleration voltage of a practical level. Furthermore, the large projected range causes a great possibility that channeling will arise during the ion implantation. Therefore, the thickness of the doped layer to be formed by the implantation of carbon ions cannot be stably controlled. The large projected range of the implanted carbon ions has prevented the implantation of carbon ions from being put into practical use for the formation of a thin doped layer.

SUMMARY OF THE INVENTION

The method for producing a semiconductor device of this invention, which overcomes the above-discussed and numerous other disadvantages and deficiencies of the prior art, comprises the steps of: implanting fluorocarbon ions in a semiconductor layer; and annealing the semiconductor layer to activate the implanted ions.

In a preferred embodiment, the aforementioned fluorocarbon ions are selected from the group consisting of monofluorocarbon ions ($CF^+$), difluorocarbon ions ($CF_2^+$), trifluorocarbon ions ($CF_3^+$) and tetrafluorocarbon ions ($CF_4^+$).

In a preferred embodiment, the aforementioned fluorocarbon ions are implanted in the semiconductor layer at a concentration of $1 \times 10^{12}$ to $2 \times 10^{15}$ cm$^{-2}$.

Thus, the invention described herein makes possible the objective of providing a method for the production of a compound semiconductor device, by which ion implantation is performed with accurate control in the depth of the implanted ions so that a thin doped semiconductor layer can be formed.

BRIEF DESCRIPTION OF THE DRAWINGS

This invention may be better understood and its numerous objects and advantages will become apparent to those skilled in the art by reference to the accompanying drawings as follows:

FIGS. 1a to 1c are sectional views showing the production of an HBT according to a method of this invention.

FIG. 2 is a sectional view showing an HBT produced by a conventional production process.

DESCRIPTION OF THE PREFERRED EMBODIMENTS

Figure 3A:
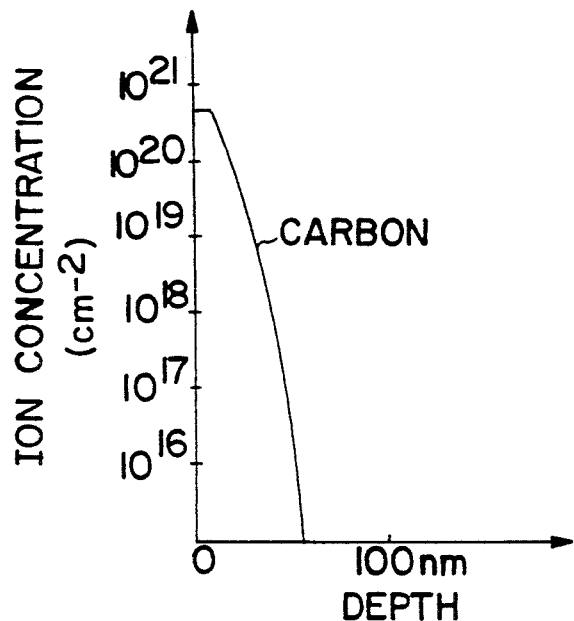
FIG. 3a is a graph showing an ion distribution in a semiconductor layer formed by ion implantation according to the method of this invention.

The method for the production of a semiconductor device according to this invention includes the steps of implanting fluorocarbon ions as an impurity into a semiconductor layer and annealing the semiconductor layer to activate the implanted fluorocarbon ions.

The atomic weights of fluorocarbons $CF$, $CF_2$, $CF_3$, and $CF_4$ are 30, 48, 66 and 84, respectively, all of which are larger than that of carbon (i.e., 12). With an increase in the atomic weight of impurity ions for doping, the projected range thereof decreases. Thus, the use of fluorocarbon ions for ion implantation makes it possible to reduce the projected range of the implanted ions, as compared with the case where carbon ions alone are used for the ion implantation. The reduction in the projected range of the implanted ions allows the ion implantation to be performed with an acceleration voltage being set up to a practical level, prevents channeling, and also reduces the variance $\Delta Rp$ in the projected range distribution. Thus, through the ion implantation according to the method of the present invention, a shallow and sharp doping profile can be obtained.

Furthermore, since carbon has a relatively small diffusion coefficient, the doping profile can be kept substantially unchanged during the activation annealing to be performed after the ion implantation.

Therefore, in the method of the present invention, the depth of implanted ions can be controlled with high accuracy, thereby enabling the formation of a thin doped semiconductor layer.

Most of the fluorine ions implanted together with carbon ions are removed away from the semiconductor layer during the activation annealing. This eliminates the possibility that a deep level will arise in the resultant doped semiconductor layer.

This invention will be further illustrated by reference to the following examples.

EXAMPLES

The method of the present invention can be applied to the production of an npn HBT including AlGaAs and GaAs layers. FIG. 1a to 1c show the production of the npn HBT according to the method of the present invention.

First, as shown in FIG. 1a, on the main plane of an $n^+$-GaAs substrate 4, an Si-doped GaAs layer 3 with a dose of $5 \times 10^{15}$ cm$^{-3}$ is grown by epitaxy. Then, $CF_4^+$ ions 1 are implanted in a concentration of $7 \times 10^{14}$ cm$^{-2}$ into the GaAs layer 3 at an acceleration voltage of 40 keV.

On the GaAs layer 3, an SiN film (not shown) is formed as an annealing cap, after which the $n^+$-GaAs substrate 4 having the GaAs layer 3 thereon is placed in a rapid thermal annealer (RTA) and subjected to annealing in an atmosphere of nitrogen for 5 seconds at a temperature of 900° C. As a result of the annealing, the implanted carbon ions are activated, so that a p-type base layer 2 is formed in a surface portion of the GaAs layer 3, as shown FIG. 1b. During the annealing, the fluorine ions implanted together with the carbon ions are removed away from the GaAs layer 3. Thereafter, the SiN film is removed by an HF solution.

The p-type base layer 2 is then subjected to an ordinary pretreatment for molecular beam epitaxy by using a solution of sulfuric acid. Then, the $n^+$-GaAs substrate 4 having the GaAs layer 3 and p-type base layer 2 thereon is placed in an apparatus used for molecular beam epitaxy, so that an Si-doped n-AlGaAs emitter layer 5 with a dose of $2 \times 10^{17}$ cm$^{-3}$ is grown on the p-type base layer 2, as shown in FIG. 1b.

Thereafter, on the upper face of the n-AlGaAs emitter layer 5 and on the back face of the $n^+$-GaAs substrate 4, n-sided contact electrodes 7 are respectively formed from AuGe/Ni/Au. The n-sided contact electrode 7 on the n-AlGaAs emitter layer 5 functions as an emitter electrode, while the n-sided contact electrode 7 on the $n^+$-GaAs substrate 4 functions as a collector electrode.

Part of the n-AlGaAs emitter layer 5 and contact electrode 7 formed thereon is removed by mesa etching in an etchant containing phosphoric acid, thereby exposing the corresponding part of the p-type base layer 2. On the exposed surface of the p-type base layer 2, p-sided contact electrodes 6 are formed from AuZn/Au, resulting in an HBT as shown in FIG. 1c.

The HBT thus produced by the method of the present invention was taken as sample A.

For the purpose of comparison, an HBT was produced as sample B with the implantation of C$^+$ ions in a concentration of $2 \times 10^{15}$ cm$^{-2}$ at an acceleration voltage of 15 keV (this voltage is lower than the lowest voltage level for practical use and cannot attain an ion current with high efficiency, but it cannot be made larger than 15 keV in view of the atomic weight of carbon). Another HBT was produced as sample C with the implantation of CO$^+$ ions in a concentration of $1 \times 10^{15}$ cm$^{-2}$ at an acceleration voltage of 20 keV.

The impurity profiles and electrical characteristic of samples A, B and C were measured.

Figure 3B:
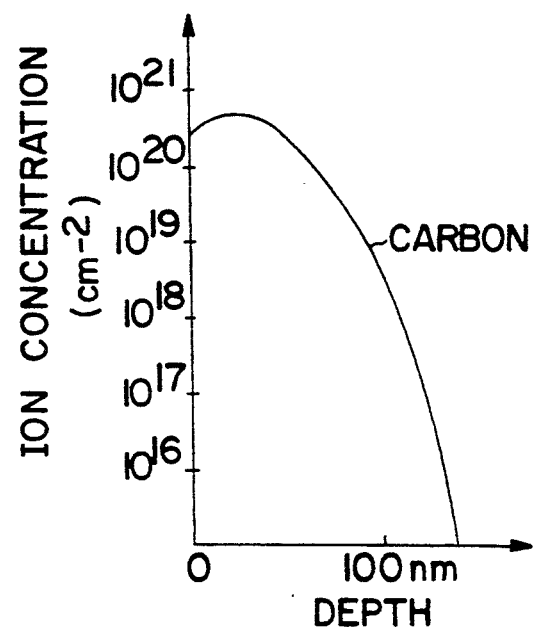
FIGS. 3b and 3c are graphs showing ion distributions in semiconductor layers formed by ion implantation according to conventional processes.
Figure 3C:
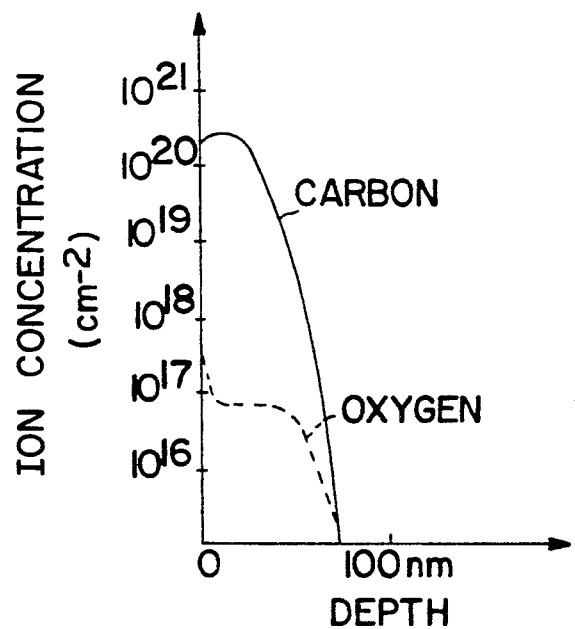

FIGS. 3a to 3c show the impurity profiles of samples A, B and C, respectively, which were measured using secondary ion mass spectroscopy (SIMS).

As shown in FIG. 3b, sample B has an implanted carbon ion profile with a depth of 130 nm or more. A Hall effect measurement was performed on the sample B to determine the fraction of the carbon ions electrically activated by the annealing. The fraction of the active carbon ions in sample B was about 5%.

As shown in FIG. 3c, oxygen ions as well as carbon ions were observed in the sample C.

On the other hand, the depth of the carbon ion profile in sample A of the present invention is within 60 nm, as shown in FIG. 3a. As a result of the Hall effect measurement which was also performed on sample A, the fraction of the carbon ions electrically activated by the annealing was turned out to be more than 10%. No appreciable amount of oxygen or fluorine was observed in sample A.

For the evaluation of the electrical characteristics of samples A, B and C, 1000 samples of each kind formed on a single substrate of 2 inches in diameter were examined. In the examination, the current amplification efficiencies $\beta$ of all the samples were measured, so that the average of the current amplification efficiencies $\beta$ of the 1000 samples on each substrate was obtained. Also, the variance $\alpha$ in the distribution of the current amplification efficiencies $\beta$ of the 1000 samples on each substrate was determined. The table below shows the average current amplification efficiency $\beta$ and the ratio of the variance $\alpha$ to the average current amplification efficiency $\beta$, with respect to samples A, B and C.

|  | Sample A | Sample B | Sample C |
|---|---|---|---|
| Current amplification efficiency $\beta$ | 212 | 65 | 72 |
| $\alpha/\beta$ Ratio (%) | 5.4 | 13.7 | 10.8 |

In sample B, the current amplification efficiency $\beta$ is small and the $\alpha/\beta$ ratio is large. This is because the thickness of the base layer became large due to the large depth of the carbon profile, and also because an in-plane distribution arose in the base layer due to channeling.

In sample C, the current amplification efficiency $\beta$ is small. This is because a deep level was caused by oxygen of the implanted CO+ ions to decrease the diffusion coefficient of minority carriers in the base layer.

On the other hand, in sample A produced by the method of the present invention, the current amplification efficiency $\beta$ is large and the $\alpha/\beta$ ratio is small, as compared with samples B and C. This indicates that the ion implantation was performed with high accuracy in the control of the depth of the implanted carbon ions in sample A.

In the above-described example, the method of the present invention is used in the production of the HBT which has an emitter on the top thereof. Alternatively, the method of the present invention may be used in the production of an HBT which has a collector on the top thereof. Also in the latter case, the same advantages as those attained in the above example can be obtained.

Furthermore, the method of the present invention is not limited to the production of HBTs. The method of the present invention can be applied to the production of any other compound semiconductor devices which require accurate control in the depth of implanted ions. Examples of such compound semiconductor devices include semiconductor devices having InGaAs/InAlAs layers, InGaAs/InP layers or other combinations of layers with lattice match, and also include those having InGaAs/AlGaAs layers or other combinations of layers with lattice mismatch, as well as those having AlGaAs/GaAs layers such as described above.

In the above example, a p-type layer is formed through the ion implantation. Alternatively, the ion implantation according to the method of the present invention may be used for accurate control of the impurity concentration in an n-type layer.

In a method of the present invention, the kind of ions to be implanted is not limited to $CF_4^+$. Other fluorocarbon ions such as $CF_3^+$, $CF_2^+$ and $CF^+$ may also be used in accordance with the purpose of the ion implantation to be performed, thereby attaining higher accuracy in the control of the impurity concentration.

As described above, according to this invention, fluorocarbon ions are implanted as an impurity into a semiconductor layer, so that the projected range of the implanted ions can be reduced, as compared with the case where carbon ions alone are used for the ion implantation. Thus, carbon which is not toxic and has a small diffusion coefficient in a compound semiconductor can be used for ion implantation without any problems associated with a large projected range. In other words, the ion implantation can be performed with the acceleration voltage being set up to a practical level, with significantly reduced channeling, and also with a reduced variance in the projected range. Through such ion implantation, a shallow and sharp impurity profile can be obtained. Furthermore, because of the small diffusion coefficient of carbon, the impurity profile can be kept substantially unchanged throughout the subsequent activation annealing. Thus, the depth of implanted ions can be controlled with high accuracy, thereby making it possible to form a thin doped layer in the production of a compound semiconductor device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a semiconductor device having a semiconductor layer in which carbon is implanted as an impurity, comprising the steps of:
   implanting fluorocarbon ions in a semiconductor layer; and
   annealing the semiconductor layer to activate the implanted ions.

2. A method according to claim 1, wherein the fluorocarbon ions are selected from the group consisting of monofluorocarbon ions ($CF^+$), difluorocarbon ions ($CF_2^+$), trifluorocarbon ions ($CF_3^+$) and tetrafluorocarbon ions ($CF_4^+$).

3. A method according to claim 1, wherein the fluorocarbon ions are implanted in the semiconductor layer at a concentration of $1 \times 10^{12}$ to $2 \times 10^{15}$ cm$^{-2}$.

* * * * *

UNITED STATES PATENT AND TRADEMARK OFFICE
CERTIFICATE OF CORRECTION

PATENT NO. : 5,158,897

DATED : October 27, 1992

INVENTOR(S) : Hiroya Sato, et al.

It is certified that error appears in the above-identified patent and that said Letters Patent is hereby corrected as shown below:

Column 6, line 46, delete "$(CF_3{}^{30})$ and insert -- $CF_3{}^+$ --.

Signed and Sealed this

Sixteenth Day of November, 1993

Attest:

BRUCE LEHMAN

*Attesting Officer*    *Commissioner of Patents and Trademarks*